United States Patent
Koizumi et al.

(10) Patent No.: US 10,586,729 B2
(45) Date of Patent: Mar. 10, 2020

(54) TRANSFER DEVICE AND CONTROL METHOD THEREOF

(71) Applicant: Tokyo Electron Limited, Tokyo (JP)

(72) Inventors: Hiroshi Koizumi, Miyagi (JP); Takehiro Shindo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 552 days.

(21) Appl. No.: 15/196,222

(22) Filed: Jun. 29, 2016

(65) Prior Publication Data
US 2017/0004992 A1 Jan. 5, 2017

(30) Foreign Application Priority Data

Jul. 1, 2015 (JP) .................................. 2015-132614

(51) Int. Cl.
*H01L 21/687* (2006.01)
*H01L 21/683* (2006.01)
*H01L 21/677* (2006.01)

(52) U.S. Cl.
CPC .. *H01L 21/68707* (2013.01); *H01L 21/67742* (2013.01); *H01L 21/6831* (2013.01)

(58) Field of Classification Search
CPC ............... B25J 19/0029; B25J 19/0041; H01L 21/67742; H01L 21/6831; H01L 21/6833; H01R 13/2421; H01R 39/10; H01R 39/12; H01R 39/643; H02K 13/003
USPC .................................................... 414/744.5
See application file for complete search history.

(56) References Cited

U.S. PATENT DOCUMENTS

| | | | | |
|---|---|---|---|---|
| 4,907,467 A | * | 3/1990 | Toyoda .................... | B25J 9/042 74/490.03 |
| 4,990,022 A | * | 2/1991 | Watanabe ................ | B25J 15/04 285/362 |
| 5,069,524 A | * | 12/1991 | Watanabe ................ | B25J 15/04 250/227.11 |
| 5,293,107 A | * | 3/1994 | Akeel ........................ | B25J 9/08 310/83 |
| 5,469,035 A | * | 11/1995 | Lowrance ................ | B25J 9/107 318/568.1 |

(Continued)

FOREIGN PATENT DOCUMENTS

| | | |
|---|---|---|
| JP | H08-083832 A | 3/1996 |
| JP | 2011-071294 A | 4/2011 |

(Continued)

*Primary Examiner* — Saul Rodriguez
*Assistant Examiner* — Brendan P Tighe
(74) *Attorney, Agent, or Firm* — Pearne & Gordon LLP (57) ABSTRACT

A transfer device can have a high durability and no limit in an operation of an arm member. An electrostatic pick 44 of a first transfer device 17 is advanced into a process module 12, and a wafer W is electrostatically attracted to and held on the electrostatic pick 44. While the wafer W is being transferred into a load lock module 14 by driving the first transfer device 17, the electrostatic pick 44 is turned into an electrically floating state, so that a state in which the wafer W is electrostatically attracted to and held on the electrostatic pick 44 is maintained. After the transferring of the wafer W to the load lock module 14 is completed, charges of the electrostatic pick 44 are neutralized, so that the wafer W is not electrostatically attracted to and held on the electrostatic pick 44.

8 Claims, 7 Drawing Sheets

(56) References Cited

U.S. PATENT DOCUMENTS

| | | | | |
|---|---|---|---|---|
| 5,523,662 A * | 6/1996 | Goldenberg | ............... | B25J 9/06 318/568.11 |
| 6,477,918 B2 * | 11/2002 | Sakamoto | .............. | F16M 11/18 475/149 |
| 2004/0114994 A1 * | 6/2004 | Tsutsumi | ............. | B25J 19/0029 403/164 |
| 2010/0178135 A1 * | 7/2010 | Laceky | ................ | B25J 19/0029 414/217 |
| 2010/0180710 A1 * | 7/2010 | Lee | ...................... | B25J 19/0029 74/490.05 |

FOREIGN PATENT DOCUMENTS

| | | |
|---|---|---|
| JP | 2011-077288 A | 4/2011 |
| JP | 2012-514544 A | 6/2012 |
| WO | 2010/081009 A2 | 7/2010 |

\* cited by examiner

TRANSFER DEVICE AND CONTROL METHOD THEREOF

CROSS-REFERENCE TO RELATED APPLICATION

This application claims the benefit of Japanese Patent Application No. 2015-132614 filed on Jul. 1, 2015, the entire disclosures of which are incorporated herein by reference.

TECHNICAL FIELD

The embodiments described herein pertain generally to a transfer device configured to transfer a transfer target object and a control method thereof.

BACKGROUND

In a plasma processing apparatus configured to perform a process such as a plasma etching process on a semiconductor wafer (hereinafter, referred to as "wafer"), for example, the wafer accommodated in a container is transferred into a plasma processing chamber which is maintained in a vacuum atmosphere by using a transfer device (transfer robot).

In general, the plasma processing apparatus includes multiple plasma processing chambers, and a single transfer device is configured to access to these multiple plasma processing chambers. As an example of such a transfer device, there is used a transfer device equipped with a transfer arm having a multi-joint structure in which multiple arm members are rotatably connected via joint units. This transfer device is configured to access to the multiple plasma processing chambers by changing intersecting angles between the arm members through rotation at the joint units.

In this transfer device, a pick is provided at a leading end of the arm member at a leading end side thereof, and the wafer is transferred while being placed on the pick. To suppress the wafer from being separated or falling down from the pick, there is proposed a pick equipped with an electrostatic attracting device configured to attract and hold the wafer electrostatically (see, for example, Patent Document 1).

Patent Document 1: Japanese Patent Laid-open Publication No. 2011-077288

The conventional multi-joint transfer device equipped with the pick having the electrostatic attracting device is provided with a cable through which a power is supplied to the electrostatic attracting device from a base of the transfer device along the arm. In this regard, it is required to secure an extra length of a cable in the vicinity of each joint unit so that the cable may not be cut in the state that the arm members are bent at maximum angles. In other words, a rotational angle at the joint unit may be limited depending on the cable length. Further, since the extra cable provided at the joint unit is bent repeatedly as the rotation at the joint unit is repeated, there may be a problem in durability of the cable.

SUMMARY

In view of the foregoing, exemplary embodiments provide a transfer device having a high durability and no limit in an operation of arm members thereof, and also provide a control method therefor.

In one exemplary embodiment, a transfer device includes a transfer arm configured to transfer a transfer target object; a driving device configured to drive the transfer arm; a pick provided at a leading end of the transfer arm and configured to mount thereon the transfer target object; an electrostatic attracting device, including an internal electrode provided in the pick, configured to attract and hold the transfer target object on the pick electrostatically; and a control device configured to control the electrostatic attracting device and the driving device. By controlling the electrostatic attracting device and the driving device, the control device is configured to turn the internal electrode into an electrically floating state after the transfer target object is electrostatically attracted to and held on the pick, and configured to allow the transfer target object to be transferred by the transfer arm while maintaining a state in which the transfer target object is electrostatically attracted to and held on the pick.

The transfer arm may include at least one arm member and a joint unit configured to hold the at least one arm member rotatably. The joint unit may include a first annular terminal and a base in which the first annular terminal is provided. The at least one arm member may include a second terminal and a force application unit configured to bring the second terminal into contact with the first annular terminal. When the at least one arm member is rotated about the joint unit, the second terminal may be slid on the first annular terminal in a circumferential direction of the first annular terminal.

In another exemplary embodiment, a transfer device includes a transfer arm configured to transfer a transfer target object; a driving device configured to drive the transfer arm; a pick provided at a leading end of the transfer arm and configured to mount thereon the transfer target object; an electrostatic attracting device, including an internal electrode provided in the pick, configured to attract and hold the transfer target object on the pick electrostatically; a control device configured to control the electrostatic attracting device; and a terminal unit configured to electrically connect the control device and the internal electrode when the pick is located within each of a transfer source and a transfer destination of the transfer target object, and configured to electrically disconnect the control device from the internal electrode while the pick is being moved from the transfer source into the transfer destination. By controlling the electrostatic attracting device, the control device is configured to allow the transfer target object to be attracted to and held on the pick electrostatically when the pick is located within the transfer source and configured to perform charge neutralization of the pick when the pick is located within the transfer destination. Further, by allowing the internal electrode to be turned into an electrically floating state through the terminal unit, a state in which the transfer target object is attracted to and held on the pick electrostatically is maintained while the pick is being moved from the transfer source to the transfer destination.

The transfer arm may include at least one arm member and a joint unit configured to hold the at least one arm member rotatably. The terminal unit may include a terminal base provided at the joint unit; first terminals provided at one surface of the terminal base to be arranged at preset positions on a circumference of a single circle; a second terminal provided at the at least one arm member; and a force application unit configured to bring the second terminal into contact with the one surface of the terminal base. A contact state and a non-contact state between the first terminals and the second terminal may be switched as the second terminal is moved on the circumference in a circumferential direction when the at least one arm member is rotated about the joint unit. Further, the control device and the internal electrode may be electrically connected when the first terminals and the second terminal are in the contact state, and the control device may be electrically disconnected from the internal electrode when the first terminals and the second terminal are in the non-contact state.

The transfer device may further include a raising device configured to allow the first terminals and the second terminal to be turned into the non-contact state by moving up the second terminal from the one surface of the terminal base against a force applied from the force application unit.

The transfer device may further include a holding device, configured to hold the transfer arm such that the transfer arm is moved forward and backward in one direction, having first terminals arranged at a preset distance therebetween in the one direction. The transfer arm may include a second terminal and a force application unit configured to bring the second terminal into contact with a surface of the holding device where the first terminals are arranged. A contact state and a non-contact state between the first terminals and the second terminal may be switched as the second terminal is moved in the one direction when the transfer arm is moved forward and backward in the one direction. The control device and the internal electrode may be electrically connected when the first terminals and the second terminal are in the contact state, and the control device may be electrically disconnected from the internal electrode when the first terminals and the second terminal are in the non-contact state.

The control device may be configured to apply a voltage signal for generating an electrostatic attracting force in the pick to the first terminals continuously while the transfer target object is being transferred.

In yet another exemplary embodiment, a control method of a transfer device configured to transfer a transfer target object from a transfer source to a transfer destination includes placing, within the transfer source, the transfer target object on a pick provided at a transfer arm; electrostatically attracting and holding the transfer target object on the pick by applying a voltage to an internal electrode provided within the pick to generate an electrostatic attracting force in the pick; driving the transfer arm to transfer the transfer target object to the transfer destination; maintaining a state in which the transfer target object is electrostatically attracted to and held on the pick by turning the internal electrode into an electrically floating state while the transfer target object is being transferred; and neutralizing charges of the pick after the transferring of the transfer target object to the transfer destination is completed.

According to the exemplary embodiments, in the transfer device equipped with the pick having the electrostatic attracting device, it is possible to construct a configuration in which there is no limit in an rotational angle at the joint unit while maintaining the transfer target object held on the pick by an electrostatic attracting force. Accordingly, a time length required to transfer the transfer target object can shortened. Further, unlike in the conventional case, by allowing the cable not to be provided at the joint, the durability can be improved. Further, since a cable need not be inserted through the joint unit, the degree of freedom in the configuration at the joint unit can be improved, so that a more compact joint unit can be achieved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings, which form a part of the description. Here, a semiconductor wafer (hereinafter, referred to as "wafer") having a diameter of 450 mm (ϕ 450 mm) is used as a transfer target object, and a substrate processing system (plasma processing system) configured to perform a plasma process on the wafer is used.

Figure 1:
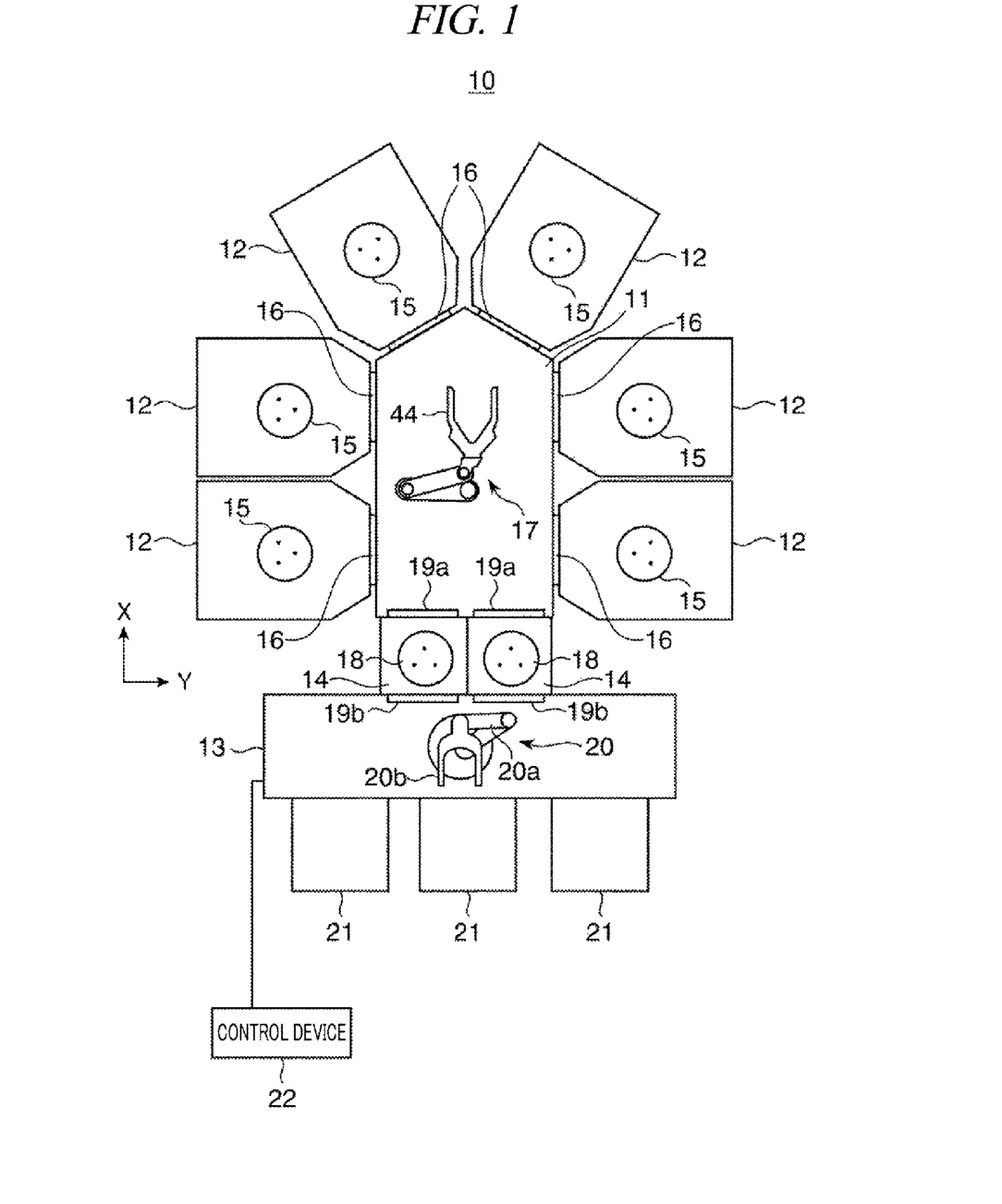
FIG. 1 is a plan view schematically illustrating a configuration of a substrate processing system according to an exemplary embodiment.

FIG. 1 is a plan view illustrating a schematic configuration of a substrate processing system 10 according to an exemplary embodiment. The substrate processing system 10 is configured to perform a plasma process on wafers W sheet by sheet. To elaborate, when viewed from the top, the substrate processing system 10 includes a transfer module 11 (substrate transfer chamber) having a substantially pentagonal shape; six process modules 12 (substrate processing chambers) radially arranged around the transfer module 11 and connected to the transfer module 11; a loader module 13 facing the transfer module 11; and two load lock modules 14 (atmosphere/vacuum switching chambers) provided between the transfer module 11 and the loader module 13.

Each process module 12 includes a vacuum chamber, and a columnar stage 15 as a mounting table configured to mount thereon a wafer W is provided within the vacuum chamber. In the process module 12, after the wafer W is mounted on the stage 15, the inside of the vacuum chamber is decompressed to a preset vacuum level, and a processing gas is introduced into the processing chamber. Further, by applying a high frequency power into the vacuum chamber, plasma is generated, and a plasma process such as an etching process is performed on the wafer W with the generated plasma. The process module 12 and the transfer module 11 are separated by an opening/closing gate valve 16.

The stage 15 of the process module 12 is provided with a multiple number of (e.g., three) thin rod-shaped lift pins configured to be protruded from a top surface of the stage 15. When viewed from the top, the lift pins are arranged on a circumference of a single circle. As the lift pins are protruded from the top surface of the stage 15, the wafer W is lifted upward from the stage 15 while being supported on the lift pins. On the contrary, as the lift pins are retracted into the stage 15, the wafer W on the lift pins is placed on the stage 15.

The transfer module 11 is maintained in a vacuum (decompressed) atmosphere, and a first transfer device 17 is provided within the transfer module 11. The first transfer device 17 has a multi-joint structure having three joint units, and a pick (hereinafter, referred to as "electrostatic pick 44") configured to hold the wafer W by an electrostatic attracting force is provided at a leading end portion of the first transfer device 17. The first transfer device 17 is configured to be moved in the X direction along a non-illustrated guide rail which is extended in the X direction on an inner bottom wall of the transfer module 11. The first transfer device 17 transfers the wafer W between the process modules 12 and the load lock modules 14. A structure and an operation of the first transfer device 17 will be elaborated later.

Each of the load lock module 14 is configured as an internal-pressure-variable chamber in which a vacuum atmosphere and an atmospheric atmosphere are switched. The load lock modules 14 and the transfer module 11 are separated by opening/closing gate valves 19a, and the load lock modules 14 and the loader module 13 are separated by opening/closing gate valves 19b. Provided within each load lock module 14 is a columnar stage 18 as a mounting table configured to mount thereon the wafer W. Like the stage 15 of the process module 12, the stage 18 is provided with lift pins configured to be protruded from a top surface of the stage 18.

When transferring the wafer W from the loader module 13 into the transfer module 11, the load lock module 14 receives the wafer W from the loader module 13 while maintaining the inside of the load lock module 14 at an atmospheric pressure. Then, after the inside of the load lock module 14 is decompressed to a vacuum level, the wafer W is transferred from the load lock module 14 into the transfer module 11. Reversely, when transferring the wafer W from the transfer module 11 into the loader module 13, the load lock module 14 receives the wafer W from the transfer module 11 while maintaining the inside of the load lock module 14 at the vacuum level. Then, after the internal pressure of the load lock module 14 is increased to the atmospheric pressure, the wafer W is transferred into the loader module 13 from the load lock module 14.

The loader module 13 is configured as an atmospheric transfer chamber having a rectangular parallelepiped shape. The load lock modules 14 are connected to one long side surface of the loader module 13, and a plurality of (here, three) FOUP mounting tables 21, on which non-illustrated FOUPs each for accommodating therein a multiple number of wafers W are mounted, are connected to the other long side surface of the loader module 13.

A second transfer device 20 configured to transfer the wafer W is provided within the loader module 13. The second transfer device 20 is equipped with a non-illustrated guide rail extended in the Y direction; and a scalar arm type transfer arm 20a. The transfer arm 20a is configured to be moved in the Y direction along the guide rail and, also, to be rotated and expanded/contracted. A pick 20b configured to hold the wafer W placed thereon is provided at a leading end of the transfer arm 20a. The pick 20b supports the wafer W by a frictional force with a pad or the like. In the loader module 13, the second transfer device 20 transfers the wafer W between the FOUP mounted on the FOUP mounting table 21 and the load lock module 14.

The substrate processing system 10 includes a control device 22 having a computer. The control device 22 controls an overall operation of the substrate processing system 10.

Figure 2A:
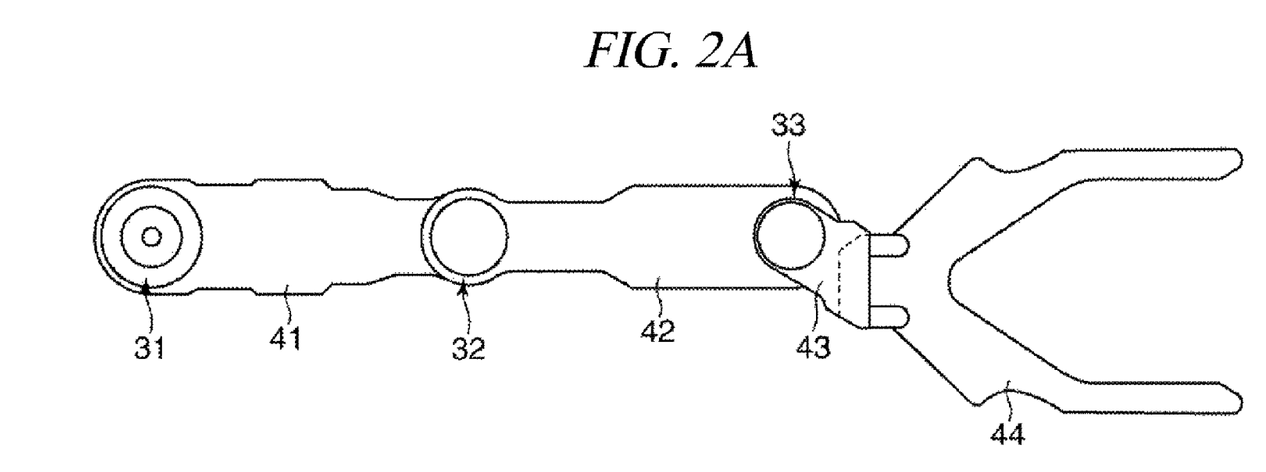
FIG. 2A and FIG. 2B are a plan view and a side view schematically illustrating a first transfer device provided in the substrate processing system of FIG. 1.
Figure 2B:
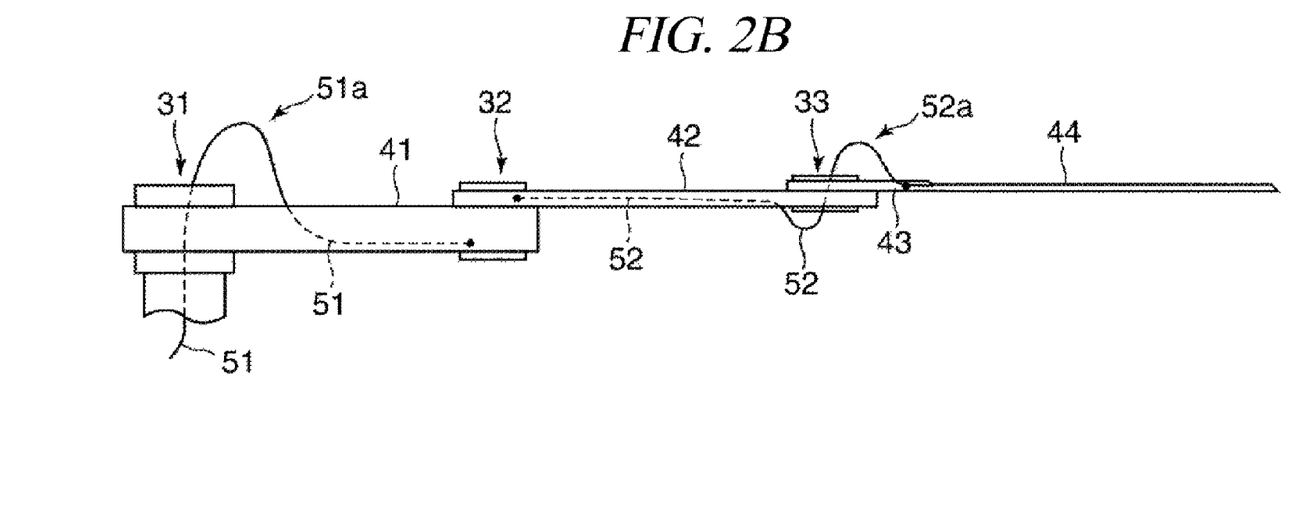

Now, a configuration, an operation and a control method of the first transfer device 17 will be elaborated. FIG. 2A is a plan view (top view) schematically illustrating a configuration of the first transfer device 17, and FIG. 2B is a side view schematically illustrating the configuration of the first transfer device 17.

The first transfer device 17 includes a first joint unit 31, a second joint unit 32, a third joint unit 33, a first arm member 41, a second arm member 42, a third arm member 43 and the electrostatic pick 44. FIG. 2A and FIG. 2B illustrate a state in which the first arm member 41 and the second arm member 42 are extended in the X direction. Further, in FIG. 2A and FIG. 2B, illustration of a driving system of the first transfer device 17 is omitted.

Each of the first joint unit 31, the second joint unit 32 and the third joint unit 33 is composed of a multiple number of members including a roller bearing and the like. The first joint unit 31 is provided at a non-illustrated base, and one end of the first arm member 41 is rotatably provided to the first joint unit 31. The other end of the first arm member 41 is fixed to the second joint unit 32. One end of the second arm member 42 is rotatably provided to the second joint unit 32, and the other end of the second arm member 42 is fixed to the third joint unit 33. Further, one end of the third arm member 43 is rotatably provided to the third joint unit 33, and the electrostatic pick 44 is fixed to the other end of the third arm member 43. Furthermore, the third arm member 43 and the electrostatic pick 44 may be formed as a single-body structure made of the same material.

The first arm member 41 is configured to be rotatable around the first joint unit 31. Further, since the second arm member 42 is configured to be rotatable around the second joint unit 32, an intersection angle between the first arm member 41 and the second arm member 42 is variable by the second joint unit 32. Since the third arm member 43 is configured to be rotatable around the third joint unit 33, an intersection angle between the second arm member 42 and the third arm member 43 is variable by the third joint unit 33. Here, however, a connection structure between the arm members in each joint unit may not be limited to the above-mentioned example as long as the above-described movement is enabled.

The electrostatic pick 44 includes a non-illustrated electrode (internal electrode) embedded therein. By applying a preset voltage to this electrode, an electrostatic force is generated, so that the wafer W placed on the electrostatic pick 44 is electrostatically attracted to and held on the electrostatic pick 44. Accordingly, in a state that the wafer W is held by the electrostatic pick 44 electrostatically, even when the first transfer device 17 is rapidly moved, the wafer W can be suppressed from being deviated from its original position on the electrostatic pick 44 or falling down from the electrostatic pick 44. Therefore, the throughput can be improved, and the wafer W can be transferred to an exact position of a transfer destination.

Now, a configuration (layout of cables and connection terminals) in which the voltage is applied to the electrode provided within the electrostatic pick 44 and a control method (voltage application method) therefor will be explained. As depicted in FIG. 2B, by using an inner hole formed in the first joint unit 31, a first cable 51 for voltage application is provided through the first joint unit 31 and the first arm member 41 from the base, and is connected to a terminal provided in the second joint unit 32. Further, a second cable 52 for voltage application is connected to another terminal provided in the second joint unit 32. The second cable 52 is extended from this another terminal to the third joint unit 33 through the inside of the second arm member 42, and is connected to the internal electrode of the electrostatic pick 44. Details of a terminal structure in the second joint unit 32 will be elaborated later.

In the present exemplary embodiment, when allowing the electrostatic pick 44 to be advanced into or retreated from the load lock module 14 and the process module 12, a rotational angle of the first arm member 41 about the first joint unit 31 and a rotational angle of the third arm member 43 about the third joint unit 33 are set to fall within preset narrow ranges, respectively. In such a case, in the first joint unit 31 and the third joint unit 33, the terminal structure in the second joint unit 32 to be described later is not used. Instead, extra length portions 51a and 52a having variable bending amounts depending on the rotations at the first arm member 41 and the third arm member 43, respectively, are provided. With this configuration, the first cable 51 and the second cable 52 can be suppressed from being cut. Furthermore, since the rotational angles at the first joint unit 31 and the third joint unit 33 are not large, loads applied to the extra length portions 51a and 51b when the first arm member 41 and the third arm member 43 are rotated may be small. Accordingly, there is no problem in durability of the extra length portions 51a and 52a.

Figure 3A:
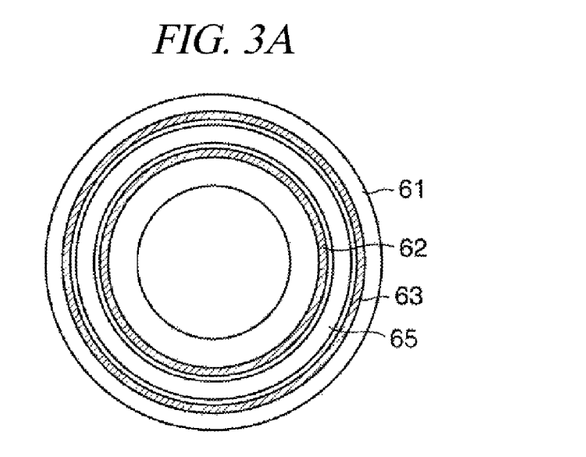
FIG. 3A to FIG. 3C are a schematic plan view and schematic cross sectional views illustrating a terminal structure in a second joint unit of the first transfer device shown in FIG. 2A and FIG. 2B.
Figure 3B:
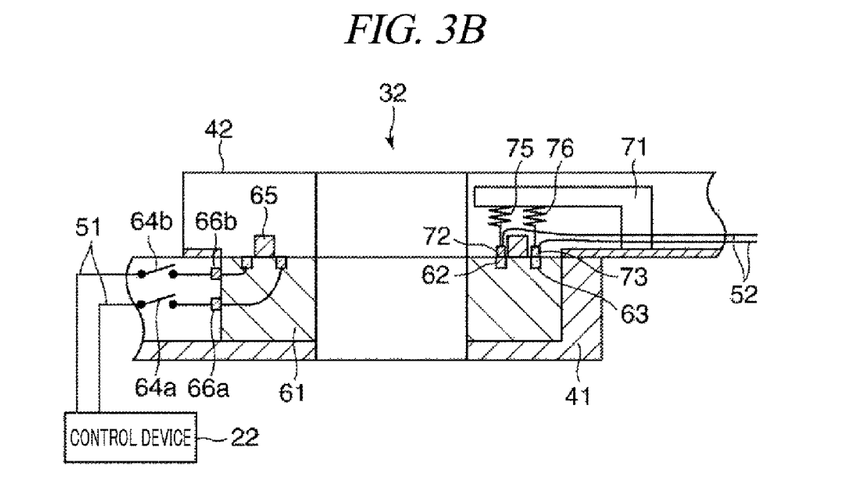

FIG. 3A is a schematic plan view illustrating the terminal structure at the side of the first arm member 41 in the second joint unit 32, and FIG. 3B is a schematic cross sectional view illustrating the terminal structure in the second joint unit 32. In the following description, the terminal structure shown in FIG. 3A and FIG. 3B will be appropriately referred to as a first terminal structure.

A terminal base 61 having a cylindrical shape and made of an insulating material (dielectric material) is fixed to a frame of the first arm member 41. A first terminal 62 and a second terminal 63, each of which has an annular shape, are concentrically arranged on a top surface of the terminal base 61. The first terminal 62 and the second terminal 63 are made of a metal, such as copper, having good electrical conductivity, and have a preset thickness to have durability against sliding motion of a third terminal 72 and a fourth terminal 73 to be described later.

On the top surface of the terminal base 61, an annular insulating member 65 is provided between the first terminal 62 and the second terminal 63. Since the first transfer device 17 is placed in the vacuum (decompressed) atmosphere, an electric discharge might be caused by a potential difference between the first terminal 62 and the second terminal 63, but the insulating member 65 is configured to suppress occurrence of such an electric discharge. Here, however, if a distance between the first terminal 62 and the second terminal 63 is sufficiently large and, thus, there is no concern that the electric discharge occurs when the voltage for generating the electrostatic attracting force in the electrostatic pick 44 is applied to the first terminal 62 and the second terminal 63, the insulating member 65 may be omitted.

The first cable 51 is connected to connection terminals 66a and 66b provided at a side surface of the terminal base 61, and the connection terminals 66a and 66b are connected to the first terminal 62 and the second terminal 63, respectively, through wirings provided within the terminal base 61. The first cable 51 is provided with switches 64a and 64b, and operations of the switches 64a and 64b are controlled by the control device 22. The switches 64a and 64b may be provided within the control device 22, within the first arm member 41 or between the control device 22 and the first arm member 41.

A supporting member 71 fixed to a frame of the second arm member 42 is provided within the second arm member 42. Springs 75 and 76 (e.g., coil springs configured to generate a force through extension/contraction) are provided at the supporting member 71, and the third terminal 72 and the fourth terminal 73 are provided to the springs 75 and 76, respectively. The spring 75 presses the third terminal 72 against the first terminal 62, and the spring 76 presses the fourth terminal 73 against the second terminal 63. The insulating member 65 has a height (thickness) sufficient for suppressing occurrence of an electric discharge between the third terminal 72 and the fourth terminal 73. The third terminal 72 and the fourth terminal 73 are connected with the second cable 52.

If the second arm member 42 is rotated around the second joint unit 32 with respect to the first arm member 41, the third terminal 72 is slid along the circumference of the first terminal 62 while being maintained in contact (pressurized contact) with the first terminal 62, and the fourth terminal 73 is slid along the circumference of the second terminal 63 while being maintained in contact with the second terminal 63. Accordingly, the second arm member 42 can be rotated with respect to the first arm member 41 without limitation. At that time, the third terminal 72 and the fourth terminal 73 are maintained in contact with and electrically connected with the first terminal 62 and the second terminal 63 all the time, respectively.

As stated above, in the second joint unit 32, since the cable for the voltage application to the electrostatic pick 44 need not be inserted through the second joint unit 32, the degree of freedom in the layout within the second joint unit 32 can be improved, so that the device can have the compact configuration.

Figure 3C:
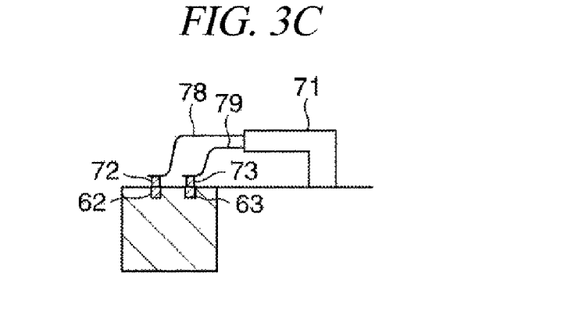

FIG. 3C is a diagram illustrating another example where the third terminal 72 and the fourth terminal 73 are brought into contact with the first terminal 62 and the second terminal 63, respectively. In the example of FIG. 3B, the springs 75 and 76 are implemented by the coil springs. However, as the force application units configured to respectively bring the third terminal 72 and the fourth terminal 73 into contact with the first terminal 62 and the second terminal 63, plate springs 78 and 79 may be used instead. The force application unit is not particularly limited.

Figure 4:
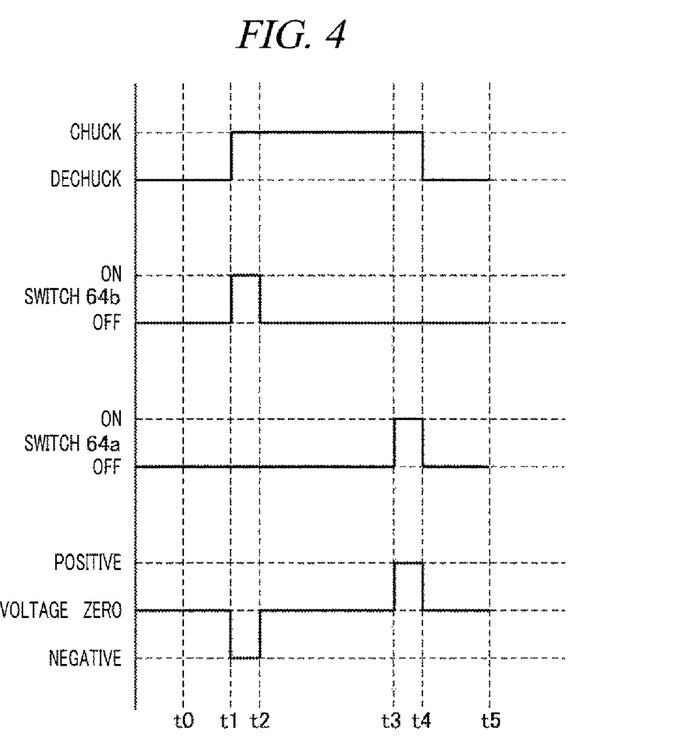
FIG. 4 is a diagram illustrating a sequence of generating an electrostatic attracting force in an electrostatic pick provided in the first transfer device of FIG. 2A and FIG. 2B.

FIG. 4 is a diagram illustrating a sequence of generating the electrostatic attracting force in the electrostatic pick 44. In FIG. 4, "Chuck" indicates a state in which the electrostatic pick 44 attracts and holds the wafer W electrostatically, and "Dechuck" indicates a state in which charges of the electrostatic pick 44 are neutralized (i.e., no electrostatic attracting force for the wafer W is generated). Further, "Positive/Zero/Negative" of "Voltage" indicates a voltage applied to the internal electrode of the electrostatic pick 44. Moreover, "On/Off" of "Switch 64a" and "Switch 64b" indicates an on state and an off state of the switches 64a and 64b. In the present exemplary embedment, when the switch 64a is on and the switch 64b is off, a positive voltage is applied to the internal electrode of the electrostatic pick 44 from the control device 22. On the contrary, when the switch 64a is off and the switch 64b is on, a negative voltage is applied to the internal electrode of the electrostatic pick 44 from the control device 22.

At a time t0, the electrostatic pick 44 is not holding the wafer W thereon. Accordingly, a state of "Dechuck", "Switches 64a and 64b: Off" and "Voltage: Zero" is created. By way of example, if the electrostatic pick 44 is advanced into the process module 12 to transfer the wafer W processed in the process module 12 (transfer source) into the load lock module 14 (transfer destination) and if the wafer W is placed on the electrostatic pick 44 at a time t1, the switch 64b is turned on ("Switch 64b: On"), and, thus, the negative voltage is applied ("Voltage: Negative"). As a result, the electrostatic attracting force is generated, and a state of "Chuck" is created.

At a time t2 upon the lapse of a preset time from the time t1, the switch 64b is turned off ("Switch 64b: Off"). Accordingly, the electrostatic pick 44 is turned into an electrically floating state, so that the state in which the electrostatic attracting force is generated is maintained. Thus, even while the wafer W is transferred into the load lock module 14 by driving the first transfer device 17, the wafer W can be suppressed from being deviated from its exact position on the electrostatic pick 44 or falling down from the electrostatic pick 44. Furthermore, since there is no limit in the rotational angle of the second arm member 42 at the second joint unit 32, the second arm 42 can be rotated at a rotational angle with the highest efficiency for the transfer destination. Therefore, a transfer time can be shortened.

Further, the preset time between the time t1 and the time t2 needs to be set to a time period during which a sufficient electrostatic attracting force for holding the wafer W is generated. Further, since an operation of taking out the electrostatic pick 44 from the process module 12 can be begun at a preset timing between the time t1 and the time t2, the time t2 does not have an influence upon the throughput of the substrate processing system 10.

At a time t3 when the electrostatic pick 44 is advanced into and stopped in the load lock module 14, the switch 64a is turned on ("Switch 64a: On"). Accordingly, the positive voltage is applied to the internal electrode of the electrostatic pick 44, and charge neutralization of the electrostatic pick 44 is performed. At a time t4, a state of "Dechuck" is created, and the wafer W on the electrostatic pick 44 can be transferred onto the stage provided within the load lock module 14. Further, if the state of "Switch 64a: On" is continued for a long time, the electrostatic attracting force may be generated again after the charge neutralization. Thus, the state of "Switch 64a: On" needs to be continued only for a time period required for the charge neutralization of the electrostatic pick 44.

A state at a time t5 when the electrostatic pick 44 is taken out of the load lock module 14 and no wafer W is mounted on the electrostatic pick 44 is the same as the state of the time t0. Accordingly, a next wafer W can be transferred between the process modules 12 or between the process module 12 and the load lock module 14 in the same way as described above.

Furthermore, in the description of FIG. 4, the electrostatic attracting force is generated by applying the negative voltage to the internal electrode of the electrostatic pick 44, and the charge neutralization of the electrostatic pick 44 is performed by applying the positive voltage of the reverse potential. However, the polarities of the applied voltages may be set to be reverse to those described above. That is, the electrostatic attracting force may be generated by applying the positive voltage to the internal electrode of the electrostatic pick 44, and the charge neutralization may be performed by applying the negative voltage of the reverse potential.

Moreover, when transferring the wafer W onto the lift pins within the process module 12 or the load lock module 14, the lift pins connected to the ground potential (earth line) come into contact with the wafer W, so that static electricity on a rear surface of the wafer W can be removed. Likewise, by way of example, after the electrostatic pick 44 holding the wafer W electrostatically is loaded into a preset module and stopped, by connecting the internal electrode of the electrostatic pick 44 to the ground potential (earth line) by the switches 64a and 64b and the control device 22 before bringing the lift pins into contact with the wafer W, the charge neutralization of the electrostatic pick 44 may be performed.

Figure 5:
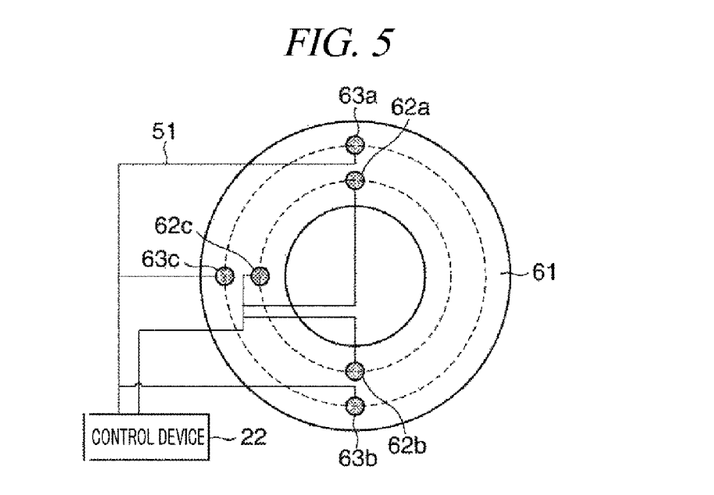
FIG. 5 is a schematic plan view illustrating another terminal structure in the second joint unit of the first transfer device of FIG. 2A and FIG. 2B.

FIG. 5 is a schematic plan view illustrating another terminal structure at the side of the terminal base 61 in the second joint unit 32. In the following description, the terminal structure shown in FIG. 5 will be appropriately referred to as a second terminal structure.

In the first terminal structure shown in FIG. 3, the first terminal 62 and the second terminal 63 each having the annular shape are provided (embedded) in the terminal base 61. In the second terminal structure depicted in FIG. 5, however, three pairs of terminals, i.e., a pair of a first terminal 62a and a second terminal 63a, a pair of a first terminal 62b and a second terminal 63b, and a pair of a first terminal 62c and a second terminal 63c are arranged (embedded) on circumferences of two concentric circles.

Further, unlike the first terminal structure in which the switches 64a and 64b are provided at the first cable 51, the second terminal structure does not have the switches 64a and 64b. FIG. 5 schematically illustrates connections between the respective terminals, the first cable 51 and the control device 22. Here, the first terminals 62a to 62c and the second terminals 63a to 63c are shown to have circular shapes when viewed from the top, but are not limited thereto. By way of non-limiting example, the first terminals 62a to 62c and the second terminals 63a to 63c may have substantially elliptical shapes having a certain length in a circumferential direction of the terminal base 61. The number of the terminal pairs provided at the terminal base 61 may not be limited to three, and two or more than four pairs of the terminals may be provided.

The reason for using the second terminal structure at the side of the first arm member 41 in the second joint unit 32 is as follows. That is, by adjusting the position of the first transfer device 17 in the X direction shown in FIG. 1, the first transfer device 17 can be configured such that an angle of the second arm member 42 with respect to the first arm member 41 at the second joint unit 32 always becomes to have two or three values in the state that the electrostatic pick 44 is advanced into the load lock module 14 and the processing module 12. In such a case, the first terminal 62 and the second terminal 63 each having the circular shape need not be provided, and the terminal structure at the side of the first arm member 41 only needs to be configured such that the third terminal 72 and the fourth terminal 73 are electrically connected with the first cable 51 only when the angle of the second arm member 42 with respect to the first arm member 41 is a preset value. Accordingly, the second terminal structure shown in FIG. 5 can be used.

Positions of the first terminals 62a to 62c and the second terminals 63a to 63c in the second terminal structure are nothing more than an example, but are not limited thereto. The configuration of the third terminal 72 and the fourth terminal 73 at the side of the second arm member 42 in the first terminal structure is applicable to the second terminal structure as well.

In FIG. 2A, when the second joint unit 32 is viewed from the first joint unit 31, in a state that the second arm member 42 is bent to the left at an angle of 90 degrees, i.e., the lengthwise direction of the first arm member 41 and the lengthwise direction of the second arm member 42 are orthogonal to each other, the third terminal 72 and the fourth terminal 73 come into contact with the first terminal 62a and the second terminal 63a, respectively. Likewise, when the second joint unit 32 is viewed from the first joint unit 31, in a state that the second arm member 42 is bent to the right at an angle of 90 degrees, i.e., the lengthwise direction of the first arm member 41 and the lengthwise direction of the second arm member 42 are orthogonal to each other, the third terminal 72 and the fourth terminal 73 come into contact with the first terminal 62b and the second terminal 63b, respectively. Further, in a state that the first arm member 41 and the second arm member 42 are overlapped when viewed from the Z direction of FIG. 2B, the third terminal 72 and the fourth terminal 73 come into contact with the first terminal 62c and the second terminal 63c, respectively.

Figure 6:
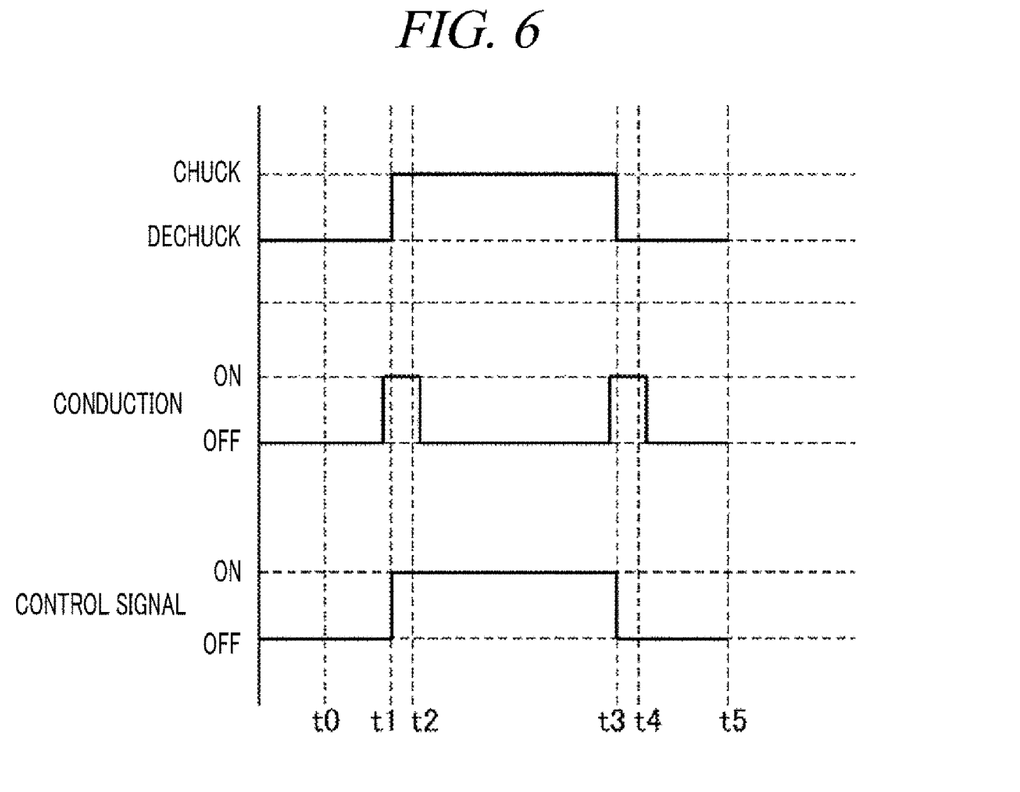
FIG. 6 is a diagram illustrating a sequence of generating an electrostatic attracting force in the electrostatic pick in a configuration in which the second joint unit of the first transfer device of FIG. 2A and FIG. 2B has the terminal structure of FIG. 5.

FIG. 6 is a diagram illustrating a sequence of generating the electrostatic attracting force in the electrostatic pick 44 in the configuration where the second joint unit 32 has the second terminal structure. In FIG. 6, "Chuck" represents a state in which the electrostatic pick 44 attracts and holds the wafer W electrostatically, and "Dechuck" indicates a state in which charges of the electrostatic pick 44 are neutralized (i.e., no electrostatic attracting force for the wafer W is generated). Further, "On" of "Conduction" represents a state in which the control device 22 and the internal electrode of the electrostatic pick 44 are electrically connected (conducted) with each other (i.e., one pair of the first terminals 62a to 62c and the second terminals 63a to 63c is in contact with the third terminal 72 and the fourth terminal 73), and "Off" of "Conduction" represents a state in which the control device 22 and the internal electrode of the electrostatic pick 44 are not connected with each other. "On" of "Control signal" indicates a state in which a signal of the voltage for generating the electrostatic attracting force in the electrostatic pick 44 is output from the control device 22, and "Off" of "Control signal" represents a state in which the electrostatic pick 44 is connected to the ground potential by the control device 22 (i.e., the electrostatic attracting force of the electrostatic pick 44 is extinguished).

At a time t0, the electrostatic pick 44 is not holding the wafer W thereon, and the third terminal 72 and the fourth terminal 73 is connected to neither of the first terminals 62a to 62c and the second terminals 63a to 63c. In this case, at the time t0, a state of "Dechuck", "Conduction: Off" and "Control signal: Off" is created.

By way of example, it is assumed that the electrostatic pick 44 is advanced into the process module 12 to transfer the wafer W processed in the process module 12 into the load lock module 14 and the wafer W is placed on the electrostatic pick 44 at a time t1. In this case, prior to the time t1, the electrostatic pick 44 is stopped within the process module 12. Accordingly, at a preset timing before the time t1, the third terminal 72 and the fourth terminal 73 come into contact with, for example, the first terminal 62a and the second terminal 63a, so that a state of "Conduction: On" is created. Further, the timing when the state of "Conduction: On" is created is determined depending on a timing when the operation (rotation) at the second joint unit 32 is ended. Further, at the time t1, the state of "Control signal: On" is created, and the state of "Chuck" is created rapidly.

If an operation of carrying the electrostatic pick 44 out of the process module 12 is begun at a time t2, in the above-described example, according to a timing when the rotation at the second joint unit 32 is performed, the third terminal 72 and the fourth terminal 73 are turned into a non-contact state with the first terminal 62a and the second terminal 63a, respectively. Accordingly, at a preset time after the time t2, a state of "Conduction: Off" is created. Since, however, the electrostatic pick 44 is turned into an electrically floating state, the state of "Chuck" in which the electrostatic attracting force is generated is maintained. Accordingly, even while the wafer W is transferred into the load lock module 14 by driving the first transfer device 17, the wafer W can be suppressed from being deviated from its position on the electrostatic pick 44 or from falling down from the electrostatic pick 44. Further, since there is no limit in the rotational angle of the second arm member 42 at the second joint unit 32, the second arm member 42 can be rotated at a rotational angle with the highest efficiency for the transfer destination, so that the transfer time can be shortened.

In the load lock module 14 as the transfer destination of the wafer W, it is assumed that the third terminal 72 and the fourth terminal 73 are in contact with the first terminal 62c and the second terminal 63c, respectively.

Further, it is assumed that the electrostatic pick 44 is advanced into the load lock module 14 and stopped at a time t3. In this case, at a preset timing prior to the time t3, the third terminal 72 and the fourth terminal 73 come into contact with the first terminal 62c and the second terminal 63c, respectively, and a state of "Conduction: On" is created. At this time, since the state of "Control signal: On" is maintained after the time t2, the electrostatic attracting force of the electrostatic pick 44 is not extinguished even when the state of "Conduction: On" is created at the timing prior to the time t3.

At the time t3, a control of "Control signal: Off" is made in order to perform the charge neutralization of the electrostatic pick 44, so that a state of "Dechuck" is created. Thus, it is possible to transfer the wafer W on the electrostatic pick 44 onto the stage provided within the load lock module 14.

At a time t4, if the electrostatic pick 44 is retreated from the load lock module 14, in the above-described example, the third terminal 72 and the fourth terminal 73 are turned into a non-contact state with the first terminal 62c and the second terminal 63c according to a timing when the rotation at the second joint unit 32 is performed. Accordingly, a state of "Conduction: Off" is created at a preset timing after the time t4. Then, since a state at a subsequent time t5 is the same as the state of the time t0, the wafer W can be transferred between the process modules 12 or between the process module 12 and the load lock module 14 in the same way as described above.

Figure 7A:
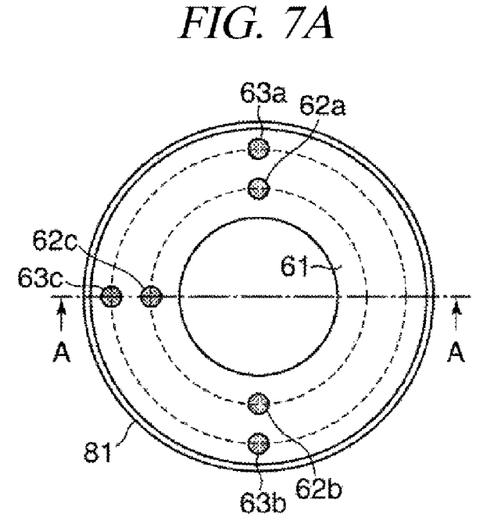
FIG. 7A to FIG. 7C are a schematic plan view, a schematic cross sectional view and a partial planar development view illustrating still another terminal structure in the second joint unit of the first transfer device of FIG. 2A and FIG. 2B.

Now, a configuration of suppressing abrasion of the third terminal 72 and the fourth terminal 73 will be explained with reference to FIG. 7A to FIG. 7C and FIG. 8A and FIG. 8B. FIG. 7A is a plan view illustrating still another terminal structure at the side of the terminal base 61 in the second joint unit 32. The terminal structure shown in FIG. 7A is different from the second terminal structure (FIG. 5) in that a wall member 81 is provided at a periphery of the top surface of the terminal base 61. Except the presence of the wall member 81, the other configurations are the same as those of the second terminal structure. Below, a configuration of the wall member 81 will be described.

Figure 7B:
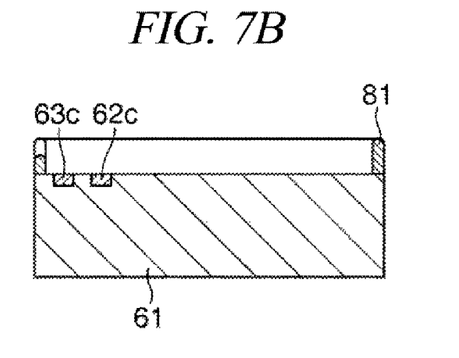
Figure 7C:
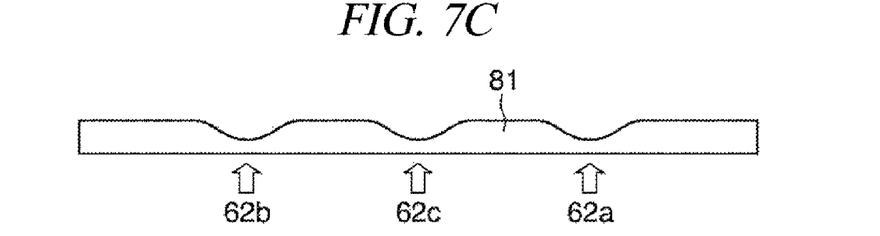

FIG. 7B is a cross sectional view taken along a line A-A of FIG. 7A, and FIG. 7C is a planar development view of the wall member 81. The wall member 81 has a structure in which the height of portions of the wall member 81, which correspond to an outside of the first terminal 62a and the second terminal 63a, an outside of the first terminal 62b and the second terminal 63b and an outside of the first terminal 62c and the second terminal 63c, is lower than the height of the other portions of the wall member 81.

Figure 8A:
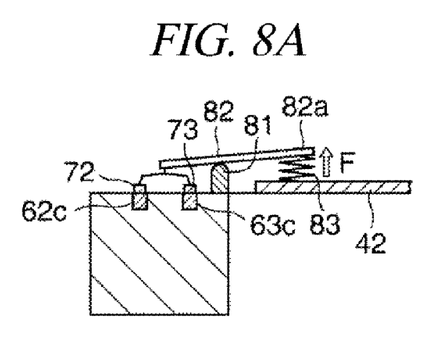
FIG. 8A and FIG. 8B are cross sectional views schematically illustrating contact state/non-contact state between terminals in the terminal structure shown in FIG. 7A to FIG. 7C.
Figure 8B:
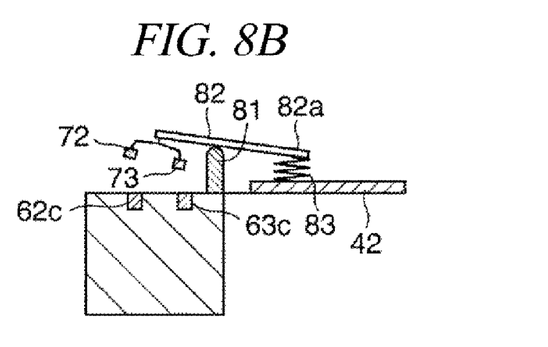

FIG. 8A is a cross sectional view schematically illustrating a state in which the first terminal 62c and the second terminal 63c are in contact with the third terminal 72 and the fourth terminal 73, respectively. FIG. 8B is a cross sectional view schematically illustrating a state in which the second arm member 42 rotates at an angle of 45 degrees from the state shown in FIG. 8A. In FIG. 8A and FIG. 8B, illustration of the second cable 52 connected to the third terminal 72 and the fourth terminal 73 is omitted.

The third terminal 72 and the fourth terminal 73 are provided to one end portion of a rod-shaped supporting member 82. The other end portion 82a of the supporting member 82 is fastened to the frame of the second arm member 42 via a spring 83 as a force application unit.

In the state illustrated in FIG. 8A, since a middle portion of the supporting member 82 in a lengthwise direction thereof is in contact with a top surface of the wall member 81, the spring 83 applies a force to the other end portion 82a of the supporting member 82 in a direction indicated by an arrow F all the time. Accordingly, the third terminal 72 and the fourth terminal 73 are pressed toward the terminal base 61 by the principle of the lever to be in contact with the first terminal 62c and the second terminal 63c.

If the state of FIG. 8A is transited to the state of FIG. 8B by rotating the second arm member 42, the position of the wall member 81 which is in contact with the supporting member 82 is moved along the top surface of the wall member 81, and the wall member 81 lifts up the supporting member 82 against the force applied from the spring 83. That is, the supporting member 82 pivots on the contact point between the wall member 81 and the supporting member 82 as the fulcrum, the spring 83 is contracted, so that the third terminal 72 and the fourth terminal 73 are raised upward from the top surface of the terminal base 61, so that the third terminal 72 and the fourth terminal 73 are no more in contact with the top surface of the terminal base 61. In this way, by setting up a configuration in which the third terminal 72 and the fourth terminal 73 are not slid on the terminal base 61, the durability of the third terminal 72 and the fourth terminal 73 can be improved. Here, the transition from the state of FIG. 8B to the state of FIG. 8A is reversed from the transition from the state of FIG. 8B to the state of FIG. 8A.

Further, a terminal structure prepared in which the wall member 81 is provided at the terminal base 61 and the contact terminals 66a and 66b are always electrically connected with the control device 22 without providing the switches 64a and 64b in the first terminal structure (FIG. 3) has substantially same function as the second terminal structure (FIG. 5). Thus, in this case, the sequence shown in FIG. 6 is applied.

Application of the first terminal structure (FIG. 3) and the second terminal structure (FIG. 5) as described above is not limited to the joint unit configured to make a rotating motion but these terminal structures may also be applicable to a transfer device configured to move the electrostatic pick 44 straightly in one direction. Below, an example where the second terminal structure is applied to the transfer device configured to move the electrostatic pick 44 straightly in one direction will be described.

Figure 9A:
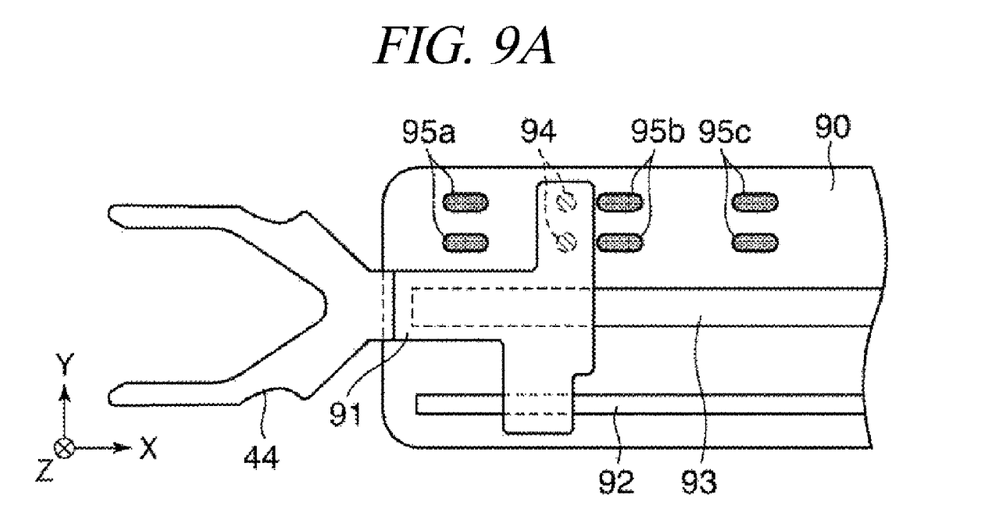
FIG. 9A and FIG. 9B are a partial plan view and a partial cross sectional view illustrating a schematic configuration of a transfer device configured to be moved straightly.

FIG. 9A is a partial plan view schematically illustrating a transfer device configured to be moved straightly. The electrostatic pick 44 is fixed at a holding member 91 (stage). The holding member 91 is engaged with a guide 93 which is provided at a base 90 and extended in the X direction such that the holding member 91 can be moved forward and backward (slid) in one direction (here, in the X direction). Further, the holding member 91 is coupled with a screw 92 which is provided at the base 90 and extended in the X direction. By rotating the screw 92 through a non-illustrated motor, the holding member 91 can be moved in the X direction.

The holding member 91 is provided with two first terminals 94 which are arranged side by side in the Y direction. Further, a pair of second terminals 95a, a pair of second terminals 95b and a pair of second terminals 95c are arranged at the base 90 at a regular distance in the X direction. In each pair, the two terminals 95a (95b, 95c) are arranged in the Y direction. When the holding member 91 is moved in the X direction, contact state/non-contact state between the first terminals 94 and the second terminals 95a, 95b and 95c are created.

Figure 9B:
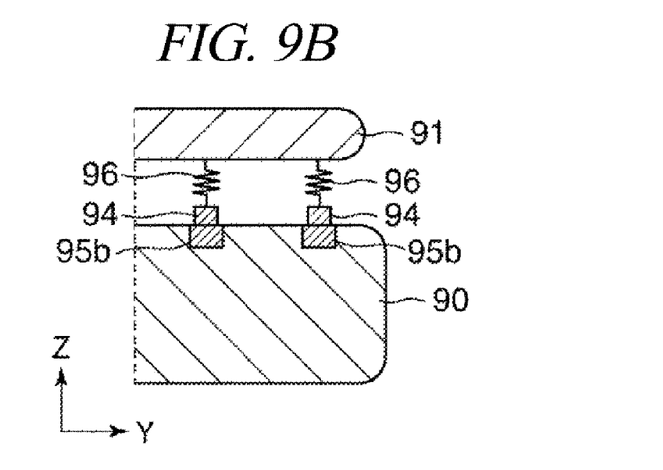

FIG. 9B is a cross sectional view illustrating a state in which the first terminals 94 are in contact with the second terminals 95b. As in the first terminal structure (FIG. 3), by the pressing the first terminals 94 against the base 90 with a spring 96, the contact and the electrical connection between the first terminals 94 and the second terminals 95b are achieved. The transfer device of FIG. 9 is controlled according to the sequence of FIG. 6.

In the above, the exemplary embodiments have been described. However, these exemplary embodiments are not limiting. By way of example, in the above description, the first terminal structure of FIG. 3 and the second terminal structure of FIG. 5 are applied to the second joint unit 32 of the first transfer device 17. However, these terminal structures are also applicable to the first joint unit 31 or the third joint unit 33 of the first transfer device 17, or a joint unit of the second transfer device 20.

With regard to the terminal structure shown in FIG. 3, the wafer W can be transferred by applying the control signals shown in FIG. 6. In such a case, by maintaining the switches 64a and 64b closed all the time (that is, by maintaining the first cable 51, the control device 22 and the connection terminals 66a and 66b connected all the time without providing the switches 64a and 64b), the control device 22 and the second cable 52 are maintained electrically connected all the time. With this configuration, while the wafer W is being held by the electrostatic pick 44, the voltage for generating the electrostatic attracting force is continuously applied to the internal electrode of the electrostatic pick 44. In this case as well, there is no limit in the rotational angle at the second joint unit 32, and it is possible to transfer the wafer W with the minimum rotational angle at the second joint unit 32.

Furthermore, the above exemplary embodiments have been described for the transfer device configured to transfer the wafer W. However, the transfer target object is not limited to the wafer W, and various other types of substrates or components may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A transfer device, comprising:
   a transfer arm configured to transfer a transfer target object;
   a driving device configured to drive the transfer arm;
   a pick provided at a leading end of the transfer arm and configured to mount thereon the transfer target object;
   an electrostatic attracting device, including an internal electrode provided in the pick, configured to attract and hold the transfer target object on the pick electrostatically; and
   a control device configured to control the electrostatic attracting device and the driving device,
   wherein the transfer arm comprises:
   a first arm member and a second arm member;
   a first joint unit; and
   a second joint unit,
   wherein a first end of the first arm member is rotatably provided to the first joint unit, and a second end of the first arm member is fixed to the second joint unit,
   a first end of the second arm member is rotatably provided to the second joint unit,
   an annular terminal is provided to the second end of the first arm member,
   a contact terminal and a force application unit configured to bring the contact terminal into contact with the annular terminal are provided to the first end of the second arm member,
   a first cable for voltage application is connected to the annular terminal in the first arm member, and
   a second cable for voltage application is connected to the contact terminal in the second arm member and connected to the internal electrode.

2. The transfer device of claim 1,
   wherein, when the second arm member is rotated about the second joint unit, the contact terminal is slid on the annular terminal in a circumferential direction of the annular terminal.

3. The transfer device of claim 1,
   wherein, by controlling a contact state between the first cable and the annular terminal, the control device is configured to turn the internal electrode into an electrically floating state after the transfer target object is electrostatically attracted to and held on the pick, and configured to allow the transfer target object to be transferred by the transfer arm while maintaining a state in which the transfer target object is electrostatically attracted to and held on the pick.

4. The transfer device of claim 1,
   wherein the annular terminal comprises a first annular terminal and a second annular terminal which are concentrically arranged, and
   an annular insulating member is provided between the first annular terminal and the second annular terminal.

5. The transfer device of claim 4,
   wherein a top surface of the annular insulating member is higher than a top surface of the first annular terminal and a top surface of the second annular terminal.

6. The transfer device of claim 4,
   wherein the contact terminal comprises a third terminal corresponding to the first annular terminal and a fourth terminal corresponding to the second annular, and
   the annular insulating member is provided between the third terminal and the fourth terminal, and has a thickness that suppress an electric discharge between the third terminal and the fourth terminal.

7. A substrate processing system comprising the transfer device of claim 1,
   wherein the transfer arm is provided in a substrate transfer chamber which is capable of being decompressed.

8. A transfer device, comprising:
   a transfer arm configured to transfer a transfer target object;
   a driving device configured to drive the transfer arm;
   an electrostatic pick provided at a leading end of the transfer arm and configured to mount thereon the transfer target object; and
   a control device configured to control the electrostatic pick and the driving device,
   wherein the transfer arm comprises:
   a first joint and second joint; and
   a first arm member and a second arm member rotatably connected by the second joint,
   wherein a first end portion of the first arm member is rotatably provided to the first joint, and a second end portion of the first arm member is fixed to the second joint, and
   a first end portion of the second arm member is rotatably provided to the second joint,
   wherein the transfer arm further comprises:
   a first terminal positioned at the second end portion of the first arm member;
   a second terminal positioned at the first end portion of the second arm member; and
   a force application unit configured to bring the first terminal into contact with the second terminal,
   wherein the second joint does not have a cable provided therethrough.

* * * * *